United States Patent [19]

Yim et al.

[11] Patent Number: 5,661,688

[45] Date of Patent: Aug. 26, 1997

[54] SEMICONDUCTOR MEMORY DEVICE WITH AN EXTENDED DATA OUTPUT MODE

[75] Inventors: Sung-min Yim; Chul-kyu Lee, both of Kyungki-do, Rep. of Korea

[73] Assignee: Samsung Electronics Co., Ltd., Suwon, Rep. of Korea

[21] Appl. No.: 639,085

[22] Filed: Apr. 24, 1996

[30] Foreign Application Priority Data

Apr. 24, 1995 [KR] Rep. of Korea ................ 95-9636

[51] Int. Cl.$^6$ ........................................ G11C 7/00
[52] U.S. Cl. .................. 365/194; 365/191; 365/193; 365/189.05
[58] Field of Search ........................... 365/193, 233, 365/194, 207, 191, 230.03, 189.05

[56] References Cited

U.S. PATENT DOCUMENTS 5,546,344  8/1996  Fawcett .................... 365/194
5,553,033  9/1996  McAdams ................. 365/194

*Primary Examiner*—David C. Nelms
*Assistant Examiner*—F. Niranjan

*Attorney, Agent, or Firm*—Cushman Darby & Cushman, IP Group of Pillsbury Madison & Sutro LLP

[57] ABSTRACT

A semiconductor memory with an extended data output mode and the semiconductor memory includes a data output buffer, being always in enable state in the extended mode, for connecting between data output lines and an output terminal; a sense amplifier for sensing and amplifying the data read from a cell and transmitting the amplified data to inner input-output buses; a bus controller, being between the inner input-output buses and the data output lines, for switching connection between the inner input-output buses and data output lines in response to a data path control signal in order to store the data transmitted from the sense amplifier to the inner input-output buses and transmit the stored data to the data output buffer even after occurrence of a column address strobe signal; and a control signal generator for generating the data path control signal which is the combined signal of the signal gained by delaying the front of the column address strobe signal by a first delay time and the signal gained by delaying the rear of the column address strobe signal by a second delay time longer than the first delay time, by which the column address cycle speed can be ensured and the cycle time can be accelerated while ensuring the margin for data transmission sufficiently as well.

10 Claims, 6 Drawing Sheets

SEMICONDUCTOR MEMORY DEVICE WITH AN EXTENDED DATA OUTPUT MODE

BACKGROUND OF THE INVENTION

The present invention relates to a semiconductor memory device and, more particularly, to a semiconductor memory device with an extended data output mode and its method of operation.

In a semiconductor memory such as a DRAM, cell data is transmitted from the addressed cell of a cell array to a column selector via bit lines, and the column selector transmits the cell data to a sense amplifier. The sense amplifier amplifies the data and transmits the amplified data to inner input-output buses, and a bus controller transmits the data on the inner input-output buses to data output lines. The data on the data output lines is transmitted to an output terminal via a data output buffer.

An extended data output mode (hereinafter referred to as EDO mode) for a semiconductor memory, with the data output path described above, is a mode for outputting data even after a column address strobe time (tCAS) while maintaining the data output buffer to always be in the enable state. Thus, because cell data have to be transmitted to the output terminal at a predetermined time from address setup, a minimum margin and a maximum margin for data transmission should be ensured on the basis of the column address strobe time (tCAS).

But, if the column address strobe time (tCAS) in the EDO mode is reduced to accelerate the cycle time, the allowable margin for data transmission cannot be ensured in a slow address setup. Also, if the margin width is enlarged to ensure the acceptable margin for data transmission while accelerating the cycle time, degradation of column address cycle (tCAC) speed occurs in a rapid address setup.

SUMMARY OF THE INVENTION

The object of the present invention is to provide a semiconductor memory with an extended data output mode, which can accelerate the cycle time by reducing tCAS without degrading column address cycle (tCAC) speed.

To accomplish this object, the semiconductor memory according to the present invention comprises a data output buffer, which is always in the enable state in the extended data output mode, for connecting data output lines with an output terminal; sense amplifying means for amplifying the data read from a cell and then transmitting the amplified data to inner input-output buses; bus control means, coupled between the inner input-output buses and the data output lines, for switching connection between the inner input-output buses and said data output lines in response to a data path control signal in order to store the data transmitted from the sense amplifying means to the inner input-output buses and transmit the stored data to the data output buffer even after the rear of a column address strobe signal; and control signal generating means for generating the data path control signal which is the combined signal of the signal gained by delaying the front of the column address strobe signal by a first delay time and the signal gained by delaying the rear of the column address strobe signal by a second delay time longer than the first delay time.

Thus, the semiconductor memory according to the present invention can ensure tCAC speed as well as accelerate the cycle time while maintaining the margin for data transmission in an extended data output mode by using the control signal generating means as described above.

BRIEF DESCRIPTION OF THE DRAWINGS

The above object and advantage of the present invention will become more apparent by describing in detail a preferred embodiment thereof with reference to the attached drawings in which:

FIG. 3 shows a detailed circuit diagram of a typical control signal generator shown in FIG. 1;

DETAILED DESCRIPTION OF THE INVENTION

Figure 1:
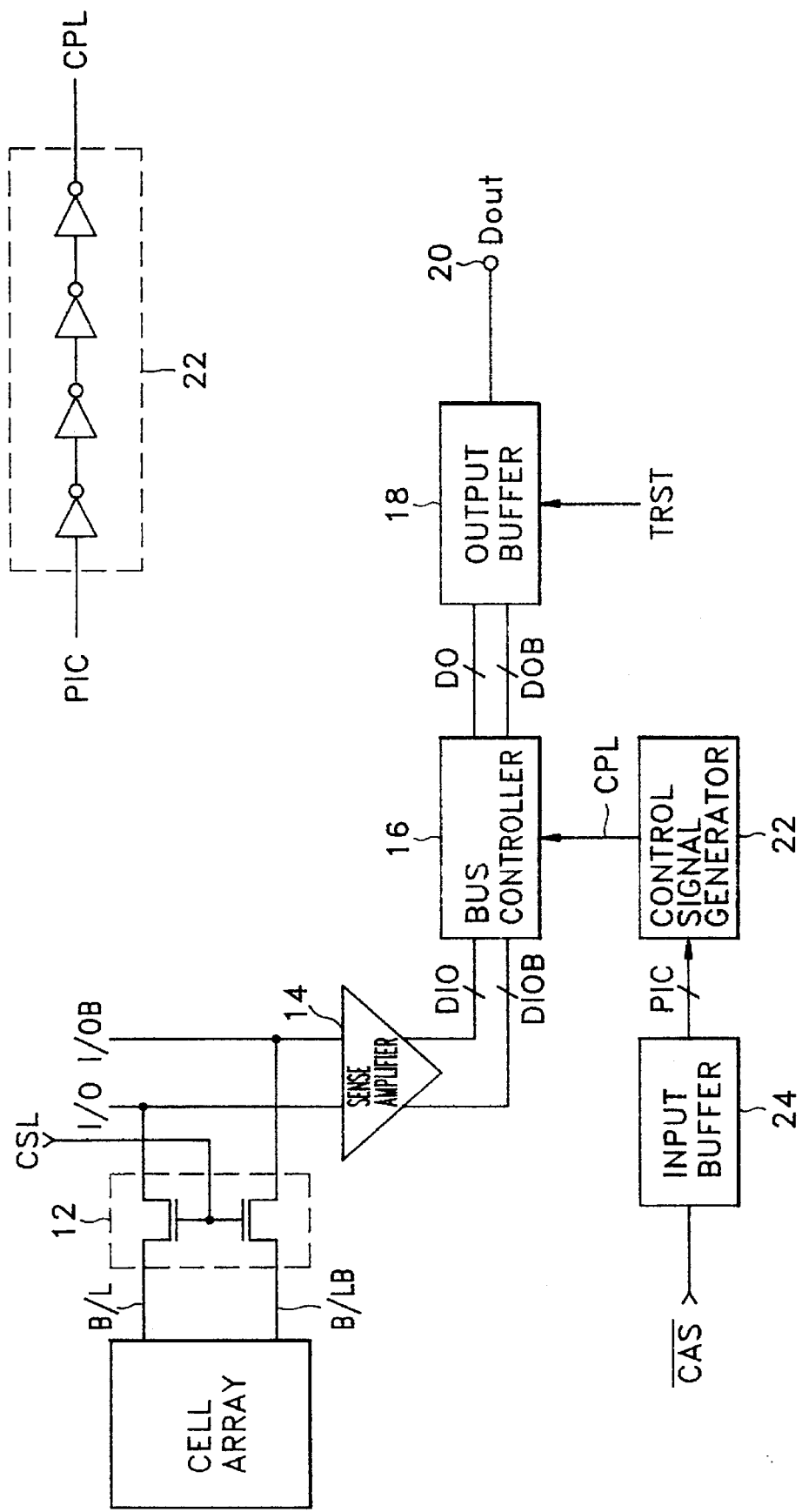
FIG. 1 shows a block diagram of a general semiconductor memory device with an extended data output mode.

FIG. 1 is a block diagram for explanation of data transmission from a cell to a data output terminal in a general semiconductor memory device.

In FIG. 1, cell data in an addressed cell of cell array 10 is transmitted to column selector 12 via a pair of bit lines (B/L, B/LB). Column selector 12 transmits the transmitted data to sense amplifier 14 via input-output buses (I/O, I/OB) in response to column select signal (CSL), and sense amplifier 14 senses and amplifies the transmitted data and then transmits the amplified data to the inner input-output buses (DIO, DIOB). Bus controller 16 transmits the data on the inner input-output buses (DIO, DIOB) to data output lines (DO, DOB), and the data on the data output lines is output as a data output signal (Dout) after being transmitted to output terminal 20 via data output buffer 18. Bus controller 16 is controlled by a data path control signal (CPL) supplied from control signal generator 22. A column address strobe signal ($\overline{CAS}$) supplied from outside is converted from TTL level to CMOS level in input buffer 24 and then is output as a data path master signal (PIC). The PIC is transmitted to control signal generator 22 and then delayed by a predetermined time, and the delayed signal is output as the data path control signal (CPL).

Figure 2:
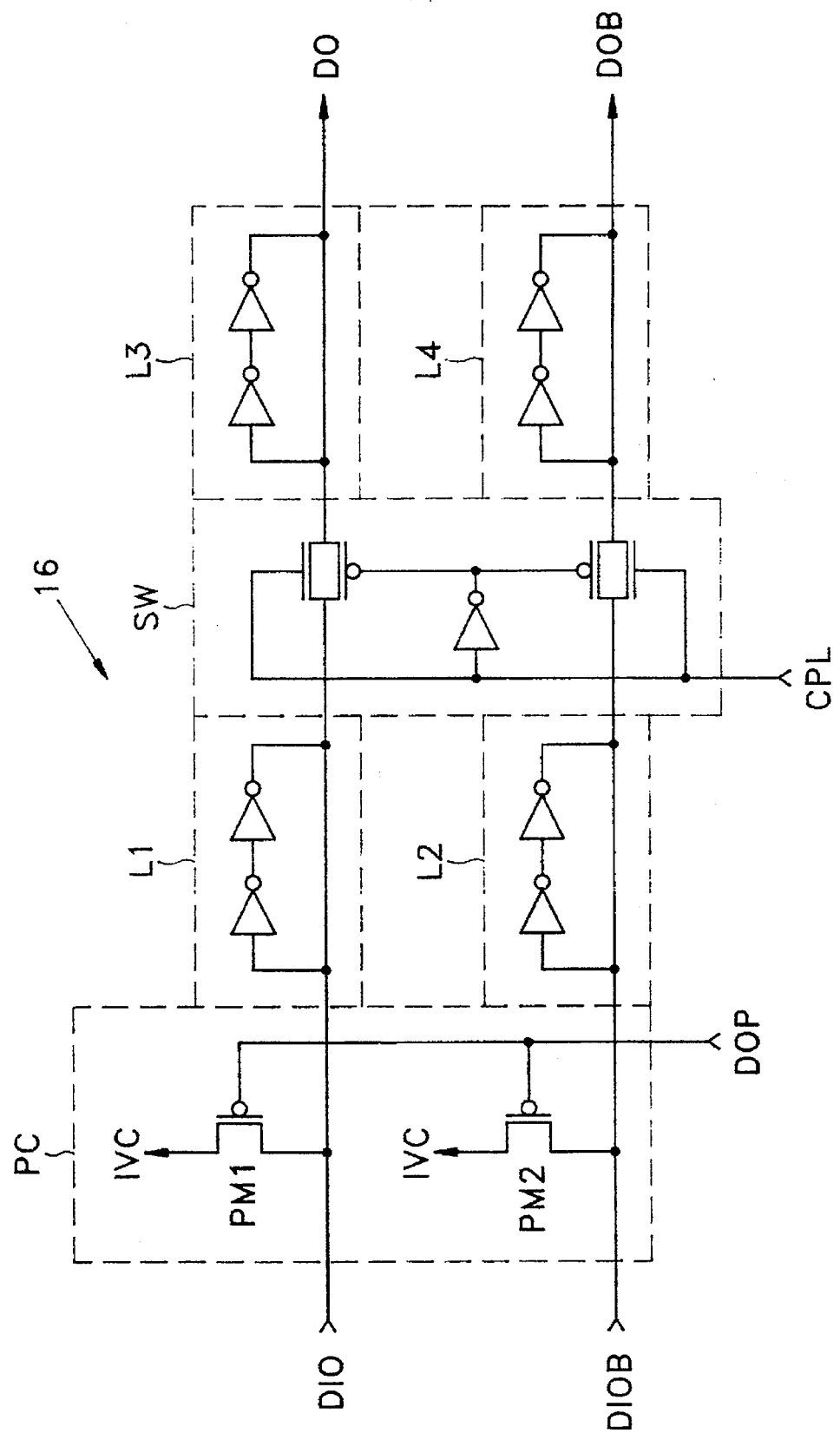
FIG. 2 shows a detailed circuit diagram of a typical bus controller shown in FIG. 1.

FIG. 2 is a detailed circuit diagram of the bus controller described in FIG. 1.

Bus controller 16 includes a precharger (PC) constituted by p-MOS transistors (PM1, PM2) for precharging the inner input-output buses (DIO, DIOB) by internal power supply voltage (IVC) in response to a control signal (DOP); first line latches (L1, L2) for storing the data transmitted to the inner input-output buses (DIO, DIOB); second line latches (L3, L4) for storing the data transmitted to the data output lines (DO, DOB); and a switch, between the first line latches and the second line latches, for switching connection between the inner input-output buses (DIO, DIOB) and the data output lines (DO, DOB) in response to the data path control signal (CPL).

FIG. 3 shows a typical control signal generator 22, being typically constituted by a serial combination of multiple CMOS inverters, for generating the data path control signal (CPL) gained by delaying the input PIC by a predetermined time.

The EDO mode operation in a conventional semiconductor memory with the construction and arrangement described above will now be described below with reference to FIGS. 4 and 5.

Figure 4:
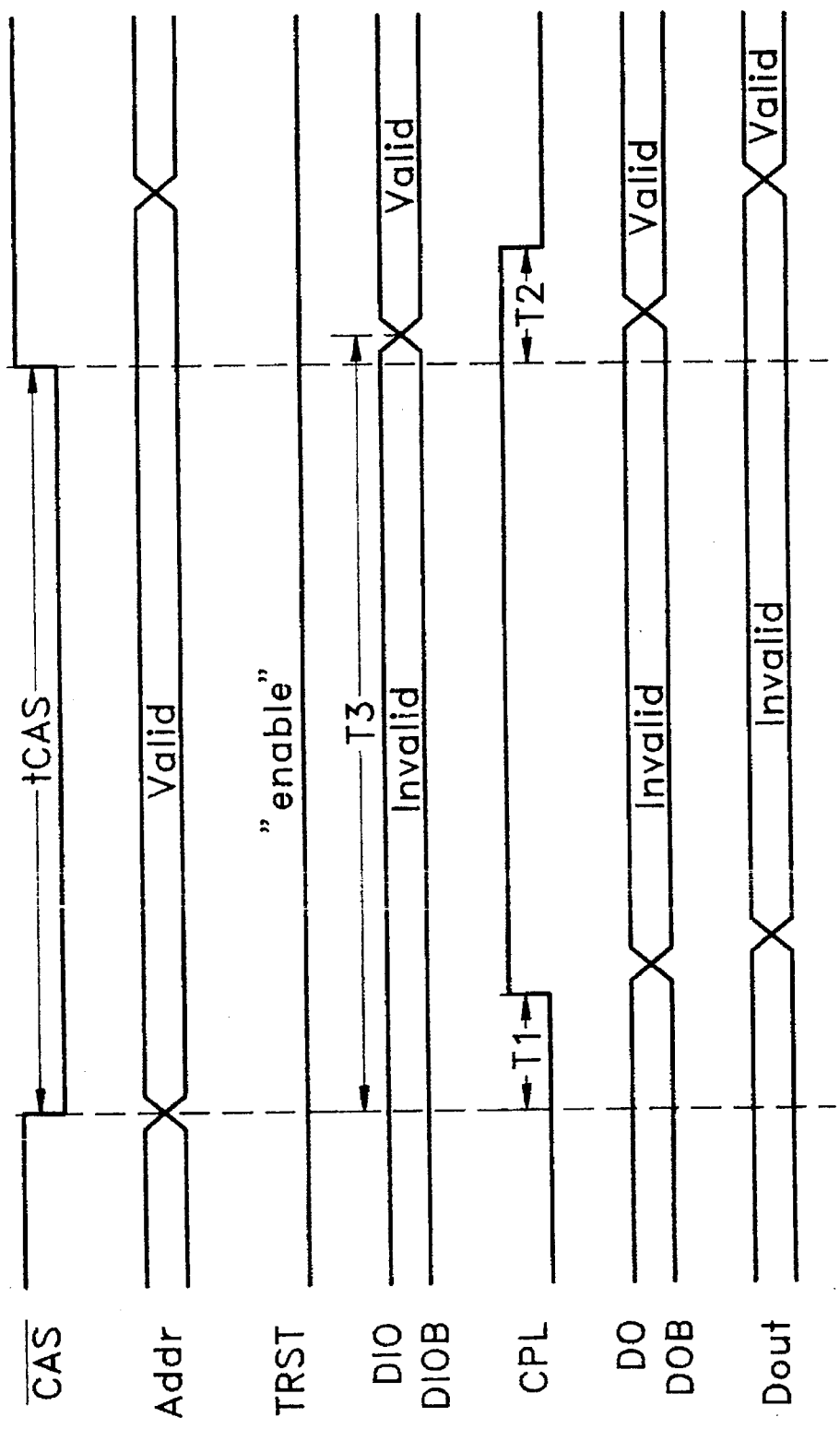
FIG. 4 shows an operation timing diagram for a slow address setup in a conventional semiconductor memory device with an extended data output mode.

FIG. 4 shows an operation timing diagram for a slow address setup in which valid selection of an address continues from the leading edge of the $\overline{CAS}$ to the trailing edge of the $\overline{CAS}$. Here, a data output buffer enable signal (TRST) in the EDO mode is always in the enable state. The inner input-output buses (DIO, DIOB) initially maintain an invalid state, but are transferred to be in the valid state after the trailing edge of the $\overline{CAS}$ so that the address cell data can be transmitted. The time (T3) from leading edge of the $\overline{CAS}$ to the point when the inner input-output buses are transferred to be in the valid state is predetermined to be constant. As the CPL is gained generated by delaying the $\overline{CAS}$ by T1 (=T2), the data on the inner input-output buses must be transmitted to the data output lines (DO, DOB) during the period when the CPL is high. The data on the data output lines is output, as the data output signal, after being delayed by a predetermined time in the data output buffer which is controlled to always be in the enable state.

Thus, if the active state of the $\overline{CAS}$ (tCAS) is reduced to accelerate the cycle time, tCAS+T2 may be shorter than the predetermined T3 because the CPL generated by delaying the $\overline{CAS}$ by T1 (=T2) is also reduced, which makes the data transmission from the inner input-output buses to the data output lines impossible.

That is, because the condition of tCAS+T2>T3 has to be satisfied for data transmission, T2 has to be increased in order to reduce the tCAS while meeting the condition of tCAS>T3−T2.

But, if T2 increases, T1 also increases because conventional control signal generator 22 is constituted by only one delay which generates the CPL by delaying the input $\overline{CAS}$, which causes another problem, described below, in a rapid address setup.

Figure 5:
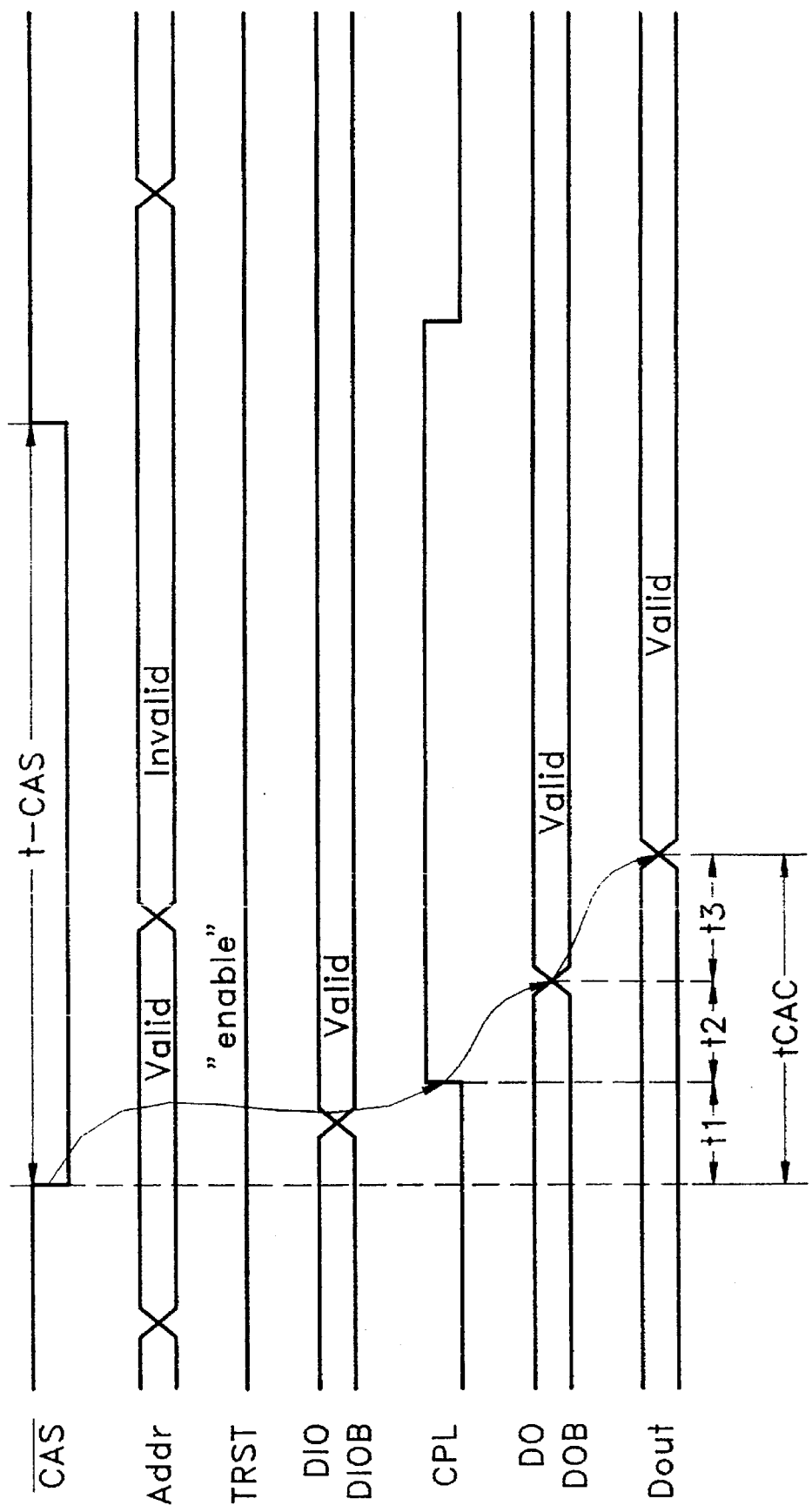
FIG. 5 shows an operation timing diagram for a rapid address setup in a conventional semiconductor memory device with an extended data output mode.

FIG. 5 shows an operation timing diagram for a rapid address setup in which valid selection of a address continues from before the leading edge of the $\overline{CAS}$ to before the trailing edge of the $\overline{CAS}$. Here, the data output buffer enable signal (TRST) in the EDO mode is always in the enable state. The inner input-output buses (DIO, DIOB) are initially in the invalid state, but are transferred to be in the valid state after the leading edge of the $\overline{CAS}$ so that the addressed cell data can be transmitted. Because the CPL is generated by delaying $\overline{CAS}$ by t1 (=T1=T2), the data which is transmitted to and then stored in the inner input-output buses is delayed by t2 and then transmitted to the data output lines (DO, DOB) after the point when the CPL is transferred to be in the high state. And the data on the data output lines is output as the data output signal (Dout) after being delayed by a predetermined time (t3) in the data output buffer which is controlled to always be in the enable state. But when T2 increases, t1 also increases because t1=T1=T2, which causes the tCAC speed degrade because tCAC=t1+t2+t3.

The problem occurs because the conventional control signal generator is constituted by only one delay. The present invention reconstitutes the control signal generator so that the tCAC speed can be ensured by decreasing T1 as accelerating well as the cycle, while ensuring the margin for data transmission by increasing T2 sufficiently and reducing tCAS.

Figure 6:
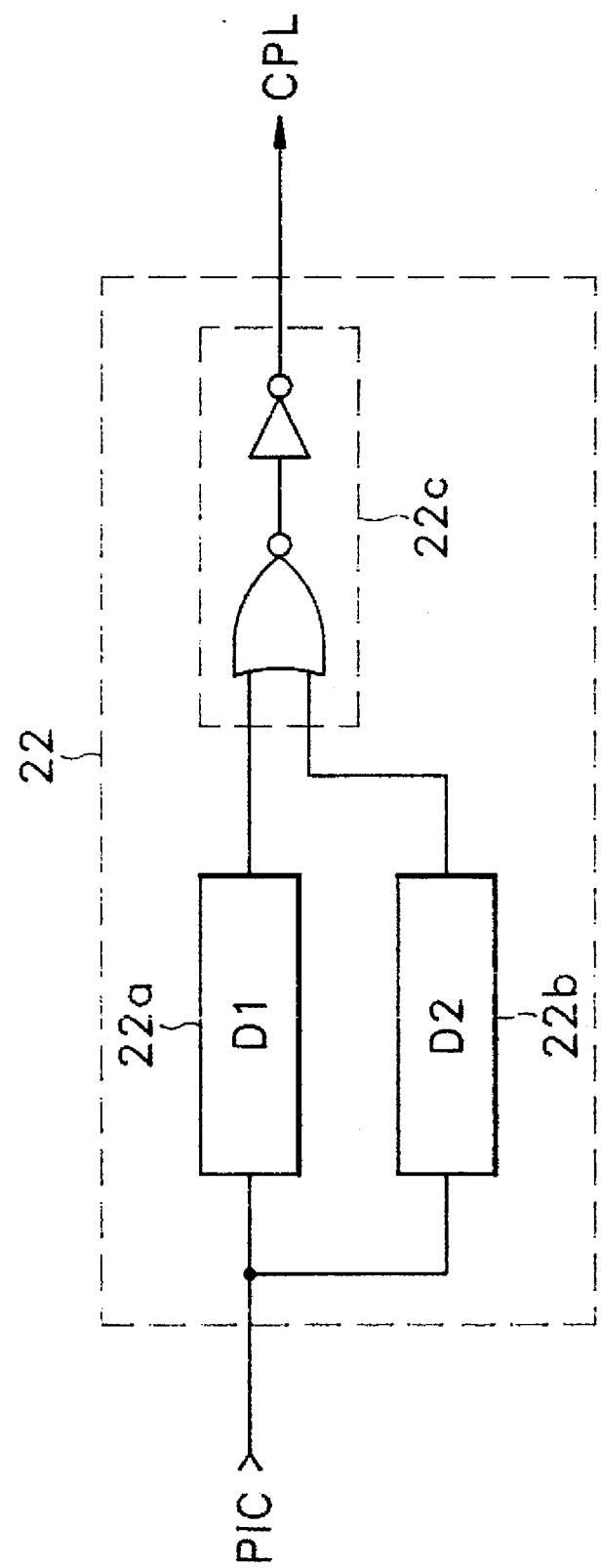
FIG. 6 shows a detailed circuit diagram of control signal generator according to the present invention.

FIG. 6 shows control signal generator 22', according to the present invention, which includes first delay 22a for delaying the input PIC by first delay time D1, second delay 22b for delaying the input PIC by second delay time D2, and logic summer 22c, constituted by a NOR gate for summing the outputs of first and second delays 22a, 22b, and an inverter. Here, D1 is shorter than D2.

Figure 7:
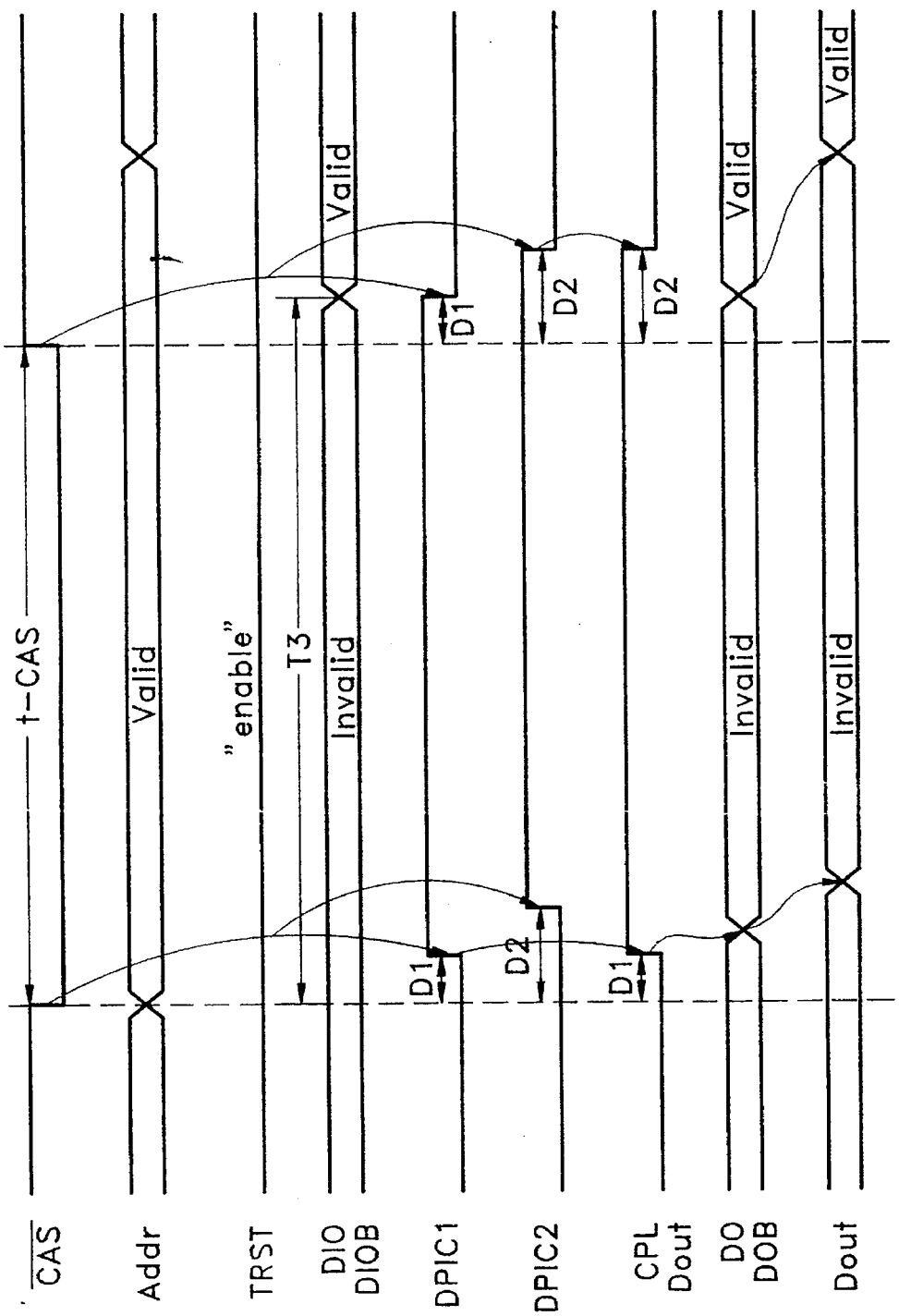
FIG. 7 shows operation timing diagram for a slow address setup in a semiconductor memory device with an extended data output mode according to the present invention.

The operation state and effect of a semiconductor memory according to the construction of the present invention will now be described with reference to FIG. 7.

In a slow address setup, valid selection of an address continues from the leading edge of the $\overline{CAS}$ to after the trailing edge of the $\overline{CAS}$. Here, the data output buffer enable signal (TRST) in the EDO mode is always in the enable state. The inner input-output buses (DIO, DIOB) are initially in the invalid state, but are transferred to be in the valid state after the trailing edge of the $\overline{CAS}$ so that the addressed cell data can be transmitted. The time (T3) from the front of the $\overline{CAS}$ to the point when the inner input-output buses is transferred to be in the valid state is predetermined to be constant.

First delay 22a receives the PIC and then outputs signal DPIC1 generated by delaying the PIC by D1, and second delay 22b receives the PIC and then outputs signal DPIC2 generated by delaying the PIC by D2. Logic summer 22c sums signals DPIC1 and DPIC2 and then generates the CPL. Here, the delay time from the leading edge of the $\overline{CAS}$ to the leading edge of the CPL is D1 and the delay time from the trailing edge of the $\overline{CAS}$ to the trailing edge of the CPL is D2.

Thus, because the delay time from the leading edge of the $\overline{CAS}$ to the leading edge of the CPL becomes D1, which is shorter than T1 generated by the conventional control signal generator, the tCAC speed is not degraded but instead ensured. And because the delay time from the trailing edge of the $\overline{CAS}$ to the trailing edge of the CPL becomes D2, which is longer than delay T2 generated by the conventional control signal generator, the cycle can be accelerated by ensuring the margin for data transmittion by reducing tCAS.

What is claimed is:

1. A semiconductor memory device with an extended data output mode, said semiconductor memory device comprising:

data output buffer means, always being enabled in the extended data output mode, for connecting data output lines with an output terminal;

sense amplifying means for sensing and amplifying data read from a cell and transmitting the amplified data to inner input-output buses;

bus control means, coupled between said inner input-output buses and said data output lines, for switching connection between said inner input-output buses and said data output lines in response to a data path control signal in order to store the amplified data transmitted from said sense amplifying means to said inner input-output buses and transmit the stored data to said data output buffer even after occurrence of a column strobe signal; and control signal generating means for generating said data path control signal, said data path control signal being generated by delaying the leading edge of said column address strobe signal by a first delay time and delaying the trailing edge of said column address strobe signal by a second delay time.

2. A semiconductor memory device with an extended data output mode as claimed in claim 1, wherein said control signal generating means comprising:

a first delay for receiving said column address strobe signal and delaying the received signal by said first delay time;

a second delay for receiving said column address strobe signal and delaying the received signal by said second delay time; and a logic summer for logically summing the outputs of said first delay and said second delay, and then outputting said data path control signal.

3. A semiconductor memory device with an extended data output mode, said semiconductor memory device comprising:

data output buffer means, always being enabled in the extended data output mode, for connecting data output lines with an output terminal;

sense amplifying means for sensing and amplifying data read from a cell and transmitting the amplified data to inner input-output buses;

bus control means, coupled between said inner input-output buses and said data output lines, for switching connection between said inner input-output buses and said data output lines in response to a data path control signal in order to store the amplified data transmitted from said sense amplifying means to said inner input-output buses and transmit the stored data to said data output buffer even after occurrence of a column strobe signal; and control signal generating means for generating said data path control signal, said data path control signal being generated from said column address strobe signal by time shifting the leading and trailing edges of said column address strobe signal by two different periods of time, respectively.

4. The semiconductor memory device of claim 3, wherein the leading edge of said column address strobe signal being time shifted a first period of time shorter than a second period of time used for time shifting the trailing edge of said column address strobe signal.

5. The semiconductor memory device of claim 4, wherein said time shifting involves delaying the leading and trailing edges of said column address strobe signal by said first and second periods of time respectively.

6. The semiconductor memory device of claim 5, said control signal generating means comprising first and second delay lines for generating first and second delay signals and logic summing means for receiving said first and second delay signals and outputting said data path control signal.

7. The semiconductor memory device of claim 6, said logic summing means comprising a NOR gate and an inverter.

8. An operating method for a semiconductor memory device, having an extended data output mode, comprising the steps of:

enabling data output buffer means during the extended data output mode for connecting data output lines with an output terminal;

sensing and amplifying data read from a cell;

transmitting the amplified data to inner input-output buses;

switching connection between said inner input-output buses and said data output lines in response to a data path control signal;

storing the transmitted amplified data in said data output buffer means even after occurrence of a column strobe signal; and generating said data path control signal by time shifting the leading and trailing edges of said column address strobe signal by two different periods of time, respectively.

9. The semiconductor memory device of claim 8, wherein the leading edge of said column address strobe signal being time shifted a first period of time shorter than a second period of time used for time shifting the trailing edge of said column address strobe signal.

10. The semiconductor memory device of claim 9, wherein said time shifting involves delaying the leading and trailing edges of said column address strobe signal by said first and second periods of time respectively.

* * * * *